(12) United States Patent
Kidoguchi et al.

(10) Patent No.: US 7,407,421 B2
(45) Date of Patent: Aug. 5, 2008

(54) LIGHT SOURCE, OPTICAL PICKUP, AND ELECTRONIC APPARATUS

(75) Inventors: Isao Kidoguchi, Kawanishi (JP); Yasuo Kitaoka, Ibaraki (JP); Hiroyoshi Yajima, Kyoto (JP); Keiji Ito, Takatsuki (JP); Akihiko Ishibashi, Osaka (JP); Yoshiaki Hasegawa, Katano (JP); Kiminori Mizuuchi, Neyagawa (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 442 days.

(21) Appl. No.: 10/993,812

(22) Filed: Nov. 19, 2004

(65) Prior Publication Data
US 2005/0116614 A1   Jun. 2, 2005

(30) Foreign Application Priority Data
Nov. 20, 2003   (JP)   ............... 2003-390517

(51) Int. Cl.
*H01J 9/00* (2006.01)
*H01L 29/04* (2006.01)
(52) U.S. Cl. .......................................... 445/24; 257/65

(58) Field of Classification Search ............. 445/23–25; 257/65, 59, 72
See application file for complete search history.

(56) References Cited

U.S. PATENT DOCUMENTS
6,956,235 B2 * 10/2005 Yamazaki et al. ............. 257/65
2002/0126404 A1   9/2002 Hattori et al.

FOREIGN PATENT DOCUMENTS
JP   2003-243761 A   8/2003
JP   2004-040051 A   2/2004

* cited by examiner

*Primary Examiner*—Joseph L Williams
(74) *Attorney, Agent, or Firm*—Panitch Schwarze Belisario & Nadel LLP

(57) ABSTRACT

A light source of the present invention includes: a semiconductor light emitting device which has a light emitting face and emits light from part of the light emitting face; a container which has a light transmitting window for transmitting the light and accommodates the semiconductor light emitting device; and a gettering portion for performing gettering of a material containing at least one of carbon and silicon. The gettering portion is positioned, in the container, in a region other than the part of the light emitting face of the semiconductor light emitting device.

7 Claims, 8 Drawing Sheets

Optical Pickup

Optical Pickup

LIGHT SOURCE, OPTICAL PICKUP, AND ELECTRONIC APPARATUS

BACKGROUND OF THE INVENTION

The present invention relates generally to a light source provided with a semiconductor light emitting device. The light source is widely used for various kinds of electronic apparatuses such as an optical disk apparatus, a copy machine, a printer, a lighting apparatus, optical communication application, and a laser display.

A semiconductor laser formed from a III-V group nitrogen semiconductor material ($Al_xGa_yIn_{1-x-y}N$ (where $0 \leq x \leq 1$, and $0 \leq y \leq 1$)) is a key device for realizing ultra high density recording in an optical disk apparatus. Presently, as a light source required for data recording with higher density than DVD, a GaN blue-violet semiconductor laser is the closest one to the practical level. Increase in power of the blue-violet semiconductor laser enables high-speed writing to an optical disk to realize, and additionally, the increase in power of the blue-violet semiconductor laser is an essential technique for pioneering new technical fields such as an application to a laser display.

Hereinafter, with reference to FIGS. 7A and 7B, a prior-art blue-violet semi-conductor laser will be described. The semiconductor laser 801 shown in the figures includes a substrate 701 and a multilayer structure formed on the substrate 701. The multilayer structure includes, from the side of the substrate 701, an n-AlGaN cladding layer 702, a quantum well active layer 703, a p-AlGaN cladding layer 704, and a p-GaN contact layer 705. In an upper portion of the semiconductor multilayer structure, the p-AlGaN cladding layer 704 and part of the p-GaN contact layer 705 are processed so as to have a stripe shape, so as to form a ridge stripe 706 for current confinement. Both sides of the ridge stripe 706 are covered with an insulating layer 707. A p-electrode 708 is formed on a top face of the ridge stripe 706, and an n-electrode 709 is formed on a back face of the substrate 701.

In the operation, according to an increase in current injected from the p-electrode 708 and the n-electrode 709, a carrier density in the quantum well active layer 703 is increased. When the value reaches a predetermined threshold carrier density, laser oscillation is obtained.

In a rewritable optical disk apparatus, a high-power semiconductor laser is desired. A conventional technique is used in which reflectivities of two end faces constituting a cavity (resonator) of a semiconductor laser are asymmetric for the purpose of realizing higher power.

In a semiconductor laser used for writing to an optical disk, cavity end faces are coated with dielectric multilayer films, so that reflectivities of the end faces are made to be asymmetric. One of the cavity end faces on the side from which laser light is emitted (a light emitting end face) is made to have a lower reflectivity, and the end face on the other side (a back end face) is made to have a higher reflectivity. For example, the reflectivity of the light emitting end face is set to be 10%, and the reflectivity of the back end face is set to be 90%. The reflectivity of the dielectric multilayer film can be controlled by a refractive index and a thickness of a dielectric layer to be deposited, and the number of layers to be stacked.

The semiconductor laser 801 shown in FIG. 7A is packaged in a can package (container) shown in FIG. 8A, and used as a light radiating element of short-wavelength light. The package (a short-wavelength light source) includes a base 803 and a cap 804. The semiconductor laser 801 and a sub-mount 802 functioning as a radiator are mounted on the base 803. The cap 804 includes a glass plate 806 functioning as a light transmitting window for taking out the light, and a metal foundation (can) 805. The semiconductor laser 801 is mounted on the base 803 via the sub-mount 802. In the base 803, openings for terminals are disposed, and the terminals are fixedly attached by a low-melting glass 807.

In order to maintain the air-tightness in the package, a gap between the glass plate 806 and the can 805 is closed by a low-melting glass 808 (fixed at several hundreds of degrees), as shown in FIG. 8B. An internal space enclosed by the base 803 and the cap 804 is filled with a nitrogen ($N_2$) gas or the like.

However, the short-wavelength light source shown in FIG. 8A causes a problem that when the semiconductor laser 801 operates with high optical output power of about 30 mW for a long period of time, a foreign material is elliptically deposited on the light emitting end face of the semiconductor laser 801.

It is found by elemental analysis (mass spectrometry such as EDX) that the foreign material is a material mainly including carbon (C) or silicon (Si). It is also found that the deposition of the foreign material is increased in accordance with the increase in optical power of the semiconductor laser 801. Therefore, the phenomenon of the deposition of the foreign material is a serious problem for increasing the power of the light source and for realizing high-speed recording to a rewritable optical disk apparatus.

According to experiments by the inventors of the present invention, it is also found that the deposition of foreign material is not only caused in the inside of the package shown in FIG. 8A. Specifically, in various electronic apparatuses (an optical pickup apparatus, for example) provided with a short-wavelength semiconductor laser with an oscillation wavelength of 450 nm or less, it is observed that the foreign material is deposited on a portion irradiated with laser light (especially in a portion with higher optical density). On the contrary, since the phenomenon of the deposition of the foreign material is not observed in other semiconductor lasers (a red laser, or an infrared laser), it is considered that the phenomenon remarkably occurs in short-wavelength semiconductor lasers with oscillation wavelength of 450 nm or less. In addition, such a phenomenon may cause even in a visible range of wavelengths when the optical power is increased.

The C and Si deposited in the package shown in FIG. 8A can be derived from various materials of slight amounts existing in the air (hydrocarbon or siloxane). For this reason, it is extremely difficult to perform an assembly process in a condition where deposition causative materials such as C or Si are not mixed in the package. In addition, it is impossible in reality to prevent the causative materials existing in the air from entering the optical disk apparatus. Even if the inside of the package can be held in a condition of C-free or Si-free, it is impossible to prevent the materials including C or Si from depositing on optical components such as a lens which is irradiated with short-wavelength laser light emitted from the light source.

SUMMARY OF THE INVENTION

The invention provides a light source capable of stably operating a short-wavelength semiconductor laser or a high-power semiconductor laser for the long term, an optical pickup, and an electronic apparatus.

The light source of the present invention includes: a semiconductor light emitting device which has a light emitting face and emits light from part of the light emitting face; a container which has a light transmitting window for transmitting the light and accommodates the semiconductor light emitting device; and a gettering portion for performing gettering of a material containing at least one of carbon and silicon, wherein the gettering portion is positioned, in the container, in a region other than the part of the light emitting face of the semiconductor light emitting device.

In a preferred embodiment, the semiconductor light emitting device includes: a substrate; a multilayer structure including a first conductive-type cladding layer, an active layer, and a second conductive-type cladding layer, the multilayer structure being formed on the substrate; a main current confinement structure for injecting a carrier into a first region of the active layer; and a sub current confinement structure for injecting a carrier into a second region of the active layer, and a portion of the light emitting face from which light generated in the second region of the active layer is emitted functions as the gettering portion.

In a preferred embodiment, the container includes: a supporting member on which the semiconductor light emitting device is placed; and a cap to which the light transmitting window is fixedly attached, the cap covering the semiconductor light emitting device, and the gettering portion is positioned on the supporting member.

In a preferred embodiment, the container includes: a supporting member on which the semiconductor light emitting device is placed; and a cap to which the light transmitting window is fixedly attached, the cap covering the semiconductor light emitting device, and the gettering portion is positioned in a region of an inner face of the light transmitting window which is not irradiated with the light.

In a preferred embodiment, the semiconductor light emitting device is formed from a III-V group nitride semiconductor material.

In a preferred embodiment, a $TiO_2$ layer is formed in part of a region which is irradiated with the light in the container.

In a preferred embodiment, an oscillation wavelength of the semiconductor light emitting device is $\lambda$, and a refractive index of the $TiO_2$ layer is n, a thickness of the $TiO_2$ layer is substantially an integral multiple of $\lambda/(2n)$.

The fabrication method of a light source according to the invention includes the steps of: preparing a semiconductor light emitting device which has a light emitting face and emits light from part of the light emitting face; preparing a container which has a light transmitting window for transmitting the light and accommodates the semiconductor light emitting device; accommodating the semiconductor light emitting device in the container, thereby blocking the semiconductor light emitting device from the air; and performing gettering of a material containing at least one of carbon and silicon, by irradiating a region of the light emitting face other than the part of the light emitting face of the semiconductor light emitting device with light in the inside of the container.

In a preferred embodiment, a wavelength of light with which the irradiation is performed in the gettering step is 450 nm or less.

In a preferred embodiment, the irradiation with light is performed by using an Hg lamp, a blue LED, a blue laser, an ultraviolet LED, or an ultraviolet laser.

In a preferred embodiment, the semiconductor light emitting device is formed from a III-V group nitride semiconductor material.

The optical unit according to the present invention includes: a semiconductor light emitting device which has a light emitting face and emits light from part of the light emitting face; a photo-detection element; a container which has a light transmitting window for transmitting the light and accommodates the semiconductor light emitting device and the photo-detection element; and a gettering portion which performs gettering of a material containing at least one of carbon and silicon, wherein the gettering portion is positioned in a region of the light emitting face other than the part of the light emitting face of the semiconductor light emitting device in the inside of the container.

In a preferred embodiment, a wavelength of the light is 450 nm or less.

The optical pickup apparatus of the present invention includes: a semiconductor light emitting device which has a light emitting face and emits light from part of the light emitting face; an optical system for converging the light emitted from the semiconductor light emitting device onto a recording medium; a photo detector for detecting light reflected from the recording medium; and a gettering portion for performing gettering of a material containing at least one of carbon and silicon, wherein the gettering portion is positioned in a region of the light emitting face other than the part of the light emitting face of the semiconductor light emitting device.

In a preferred embodiment, a wavelength of the light is 450 nm or less.

In a preferred embodiment, the optical pickup apparatus further includes: a semiconductor substrate for supporting the semiconductor light emitting device, wherein the photo detector includes a plurality of photo diodes formed on the semiconductor substrate.

In a preferred embodiment, the semiconductor substrate is formed from silicon, the semiconductor substrate has a recessed portion formed on a principal surface and a micro mirror formed on one side face of the recessed portion, the semiconductor light emitting device is disposed in the recessed portion of the silicon substrate, and an angle formed by the micro mirror and the principal surface of the semiconductor light emitting device is set so that the light emitted from the semiconductor light emitting device travels in a direction substantially perpendicular to the principal surface by means of the micro mirror.

In a preferred embodiment, the semiconductor light emitting device is formed from a III-V group nitride semiconductor material.

The electronic apparatus of the present invention includes: a semiconductor light emitting device which has a light emitting face and emits light from part of the light emitting face; and an apparatus for performing gettering, decomposition, or vaporization of a material containing at least one of carbon and silicon.

In a preferred embodiment, the apparatus is an apparatus for generating plasma.

In a preferred embodiment, the apparatus includes a light source which emits light having a wavelength of 450 nm or less.

In a preferred embodiment, the electronic apparatus further comprises a photo catalytic effect material film disposed in a position which receives at least part of the light emitted from the light source, wherein the photo catalytic effect material film has a function of decomposing and vaporizing a compound of carbon or Si.

In a preferred embodiment, the light source is an Hg lamp, a blue LED, a blue laser, an ultraviolet LED, or an ultraviolet laser.

In a preferred embodiment, the semiconductor light emitting device is formed from a III-V group nitride semiconductor material.

BRIEF DESCRIPTION OF THE SEVERAL VIEWS OF THE DRAWINGS

The foregoing summary as well as the following detailed description of the preferred embodiments of the invention, will be better understood when read in conjunction with the appended drawings. For the purpose of illustrating the invention, there is shown in the drawings an embodiment which is presently preferred. It should be understood, however, that the invention is not limited to the precise arrangements and instrumentalities shown.

DETAILED DESCRIPTION OF THE INVENTION

Embodiment 1

Figure 1:
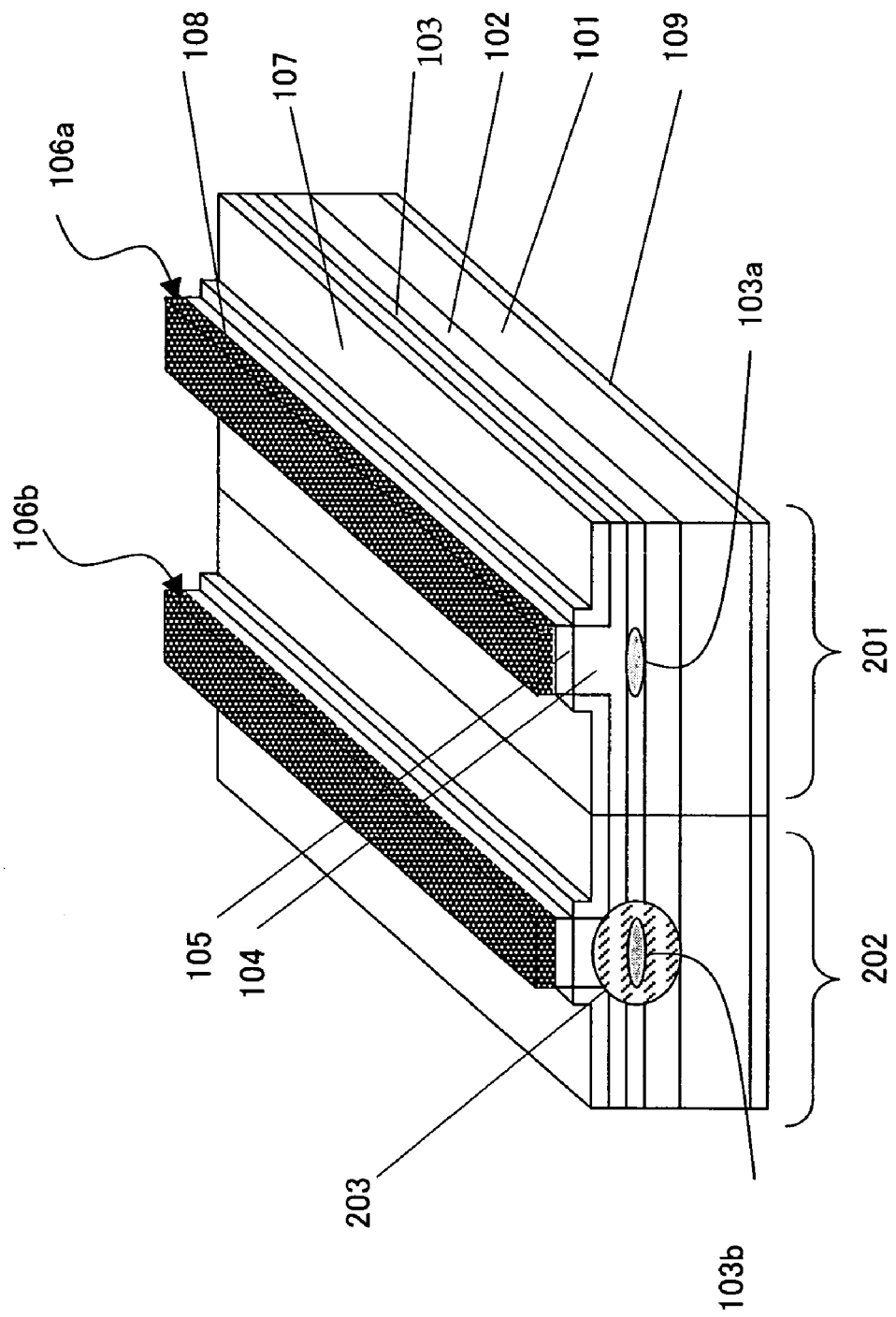
FIG. 1 is a perspective view of a semiconductor laser used in a first embodiment of a light source according to the present invention.

With reference to FIG. 1, a first embodiment of a light source according to the present invention will be described.

Figure 8B:
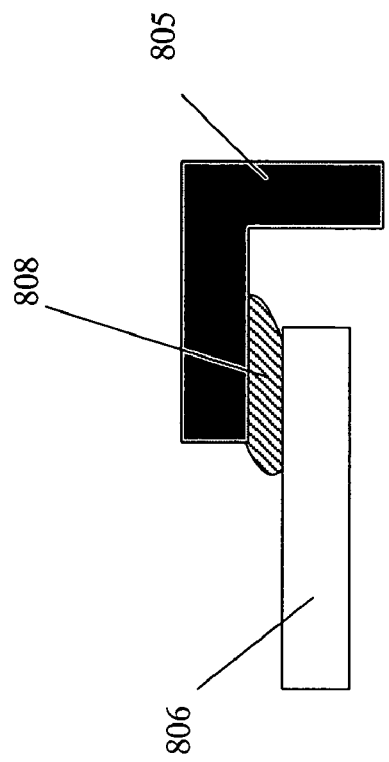
FIG. 8B is a partially enlarged section view showing the vicinity of an adhesive portion of a glass and a can.
Figure 8A:
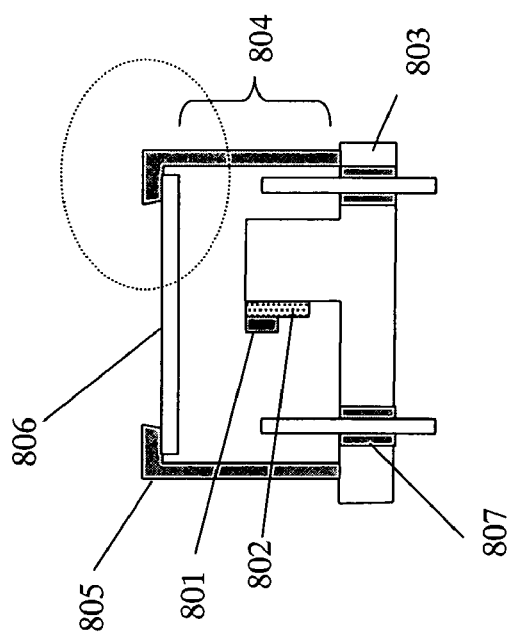
FIG. 8A is a construction view of an example of a prior-art semiconductor laser element.

The light source of this embodiment comprises a nitride semiconductor laser element accommodated in a container which is not shown. The container may have a known construction as shown in FIG. 8A, for example. A main feature of this embodiment resides in that part of the semiconductor laser element functions as a gettering portion for performing gettering of a material containing at least one of carbon and silicon.

The semiconductor laser in this embodiment includes an n-type GaN substrate 101 and a semiconductor multilayer structure formed on the n-type GaN substrate 101, as shown in FIG. 1. The semiconductor multilayer structure includes an n-type cladding layer (a first cladding layer) 102 of n-type AlGaN, a quantum well active layer 103 of a multi quantum well structure including InGaN, a p-type cladding layer (a second cladding layer) 104 of p-type AlGaN, and a contact layer 105 of p-type GaN.

The semiconductor laser includes a main stripe structure 106a for injecting carriers into a first region 103a of the active layer 103 and a sub stripe structure 106b for injecting carriers into a second region 103b of the active layer 103. In the semiconductor laser, a portion in which the main stripe structure 106a is formed functions as a first semiconductor laser 201 which emits laser light in operation. On the other hand, in the semiconductor laser, a portion in which the sub stripe structure 106b is formed functions as a second semiconductor laser 202 which performs laser emission required for the gettering when the gettering is to be performed. Specifically, among the light emitting end faces of the shown semiconductor laser, a portion from which light generated in the second region 103b of the active layer 103 (short-wavelength light having wavelengths of 450 nm or less, for example) is emitted functions as the gettering portion 203. Depositions containing carbon or Si are formed on the portion and the periphery thereof.

The main stripe structure 106a and the sub stripe structure 106b in this embodiment are both formed by processing the p-type contact layer 105 and the p-type cladding layer (the second cladding layer) 104 so as to have ridge stripe shapes. In an upper face of the semiconductor multilayer structure, a p-electrode 108 is formed in the ridge portion, and an insulating layer 107 is formed in the other portion. On a back face of the n-GaN substrate 1, an n-electrode 109 is formed.

In this embodiment, a cavity length, a chip width, and a thickness of the semiconductor laser are set to be 600 μm, 400 μm, and 80 μm, respectively. A ridge stripe width of the first semiconductor laser 201 is about 1.7 μm, and a ridge stripe width of the second semiconductor laser 202 is 10 μm.

In the light source of this embodiment with the above-described configuration, the second semiconductor laser 202 is used for decomposing materials containing C and Si included in the atmosphere in the container, and preferentially depositing (gettering) the decomposed materials on the emitting end face. Therefore, the second semiconductor laser 202 operates and emits laser light, only when the gettering is required.

In the case where the above-described semiconductor laser is mounted in a package so as to block off the air of the outside, typically, the semiconductor laser become commercially available after the gettering by the second semiconductor laser 202 is performed. After the semiconductor laser comes onto the market, the laser light required for functioning as a light source is emitted from the first semiconductor laser 201, so that it is unnecessary to operate the second semiconductor laser 202. Therefore, electrode terminals disposed on the package are connected only to the first semiconductor laser 201. Alternatively, a configuration in which after the semiconductor laser is sold and attached to various electronic apparatuses, a current is caused to flow to the second semiconductor laser 202 at regular intervals or at irregular intervals so as to perform the gettering may be adopted.

In the case where the light source of this embodiment is used in an electronic apparatus such as an optical disk apparatus, first, a bias voltage is applied to the second semiconductor laser 202 for a predetermined period of time (for 24 hours, for example), so as to produce laser oscillation. Accordingly, foreign materials containing carbon and Si existing in the package are deposited on the emitting end faces of the second semiconductor laser 202. In a preferred embodiment, such gettering is performed before the light source of this embodiment is attached to the optical disk apparatus or the like.

As the optical power of the second semiconductor laser 202 is increased, a higher effect of the gettering can be attained. Therefore, it is preferred that the stripe width of the second semiconductor laser 202 be set to be larger, so as to increase the optical power. As described above, the stripe width of the second semiconductor laser 202 is set in view of the gettering effect, irrespective of the stripe width of the fist semiconductor laser 201.

In this embodiment, one of the two end faces which constitute the cavity of the semiconductor laser on the side from which the laser light is emitted (a light emitting end face) is coated with an $SiO_2$ layer, and the $SiO_2$ layer is further coated with $TiO_2$ layer. A backward end face as an end face on the opposite side to the light emitting end face is coated with a multilayer film of $SiO_2$ and $Nb_2O_5$. The reflectivity of the light emitting end face and the reflectivity of the backward end face are set to be 10% and 90%, respectively. A power reflectivity of the light emitting end face is adjusted in the range of 1% to 3% for the purpose of increasing the optical power.

If the crystal structure of $TiO_2$ is appropriately selected, the $TiO_2$ layer disposed on the light emitting end face exhibits photo-catalytic effect, so as to decompose materials containing carbon. Therefore, the materials which are to be subjected to the gettering are advantageously reduced.

In order to increase the photo-catalytic effect of $TiO_2$, it is preferred that a layer of $TiO_2$ having an anatase-type crystal structure be deposited on the light emitting end face of the semiconductor laser. However, there is no problem even if the anatase-type crystal structure and a rutile-type crystal structure mixedly exist. Such $TiO_2$ can be preferably formed by sputtering such as RF sputtering or ECR sputtering, or by an application method by means of a $TiO_2$ sol spray, for example.

In this embodiment, when the $TiO_2$ layer positioned on the uppermost surface of the light emitting end face of the semiconductor laser is irradiated with laser light, strong photo-catalysis occurs, so as to change hydrocarbon existing in the periphery into $CO_2$, $H_2O$, and the like. Accordingly, the deposition of carbon on the emitting end face of the semiconductor laser can be prevented.

When an oscillation wavelength of the laser is $\lambda$, and the refractive index of the $TiO_2$ layer is n, it is preferred that the thickness of the $TiO_2$ layer deposited on the light emitting end face of the semiconductor laser be substantially an integral multiple of $\lambda/(2n)$.

In this embodiment, the semiconductor laser is fabricated by using the n-type GaN substrate 101. However, the substrate is not necessarily formed from GaN. The substrate for the semiconductor laser used in the present invention may be a substrate on which a III-V group nitride system semiconductor material can be epitaxially grown, such as a sapphire substrate or an SiC substrate.

The semiconductor laser in this embodiment has two ridge stripe structures, but the number of ridge stripe structures may be 3 or more. In the case where the number of ridge stripe structures is N (N is an integer of 2 or more), the number (M) of ridge stripe structures for defining the semiconductor laser portion used for gettering satisfies the relationship of $1 \leq M \leq N-1$.

Even in a high power semiconductor laser which does not necessarily require laser oscillation only in a fundamental transverse mode, if the configuration of the present invention is adopted, the deposition of the foreign materials on the light emitting end face of the first semiconductor laser 201 is suppressed.

Embodiment 2

Hereinafter, with reference to FIGS. 2A to 2C, a second embodiment of a light source according to the present invention will be described. In this embodiment, as a semiconductor light emitting device, a nitride semiconductor laser is used.

Figure 2B:
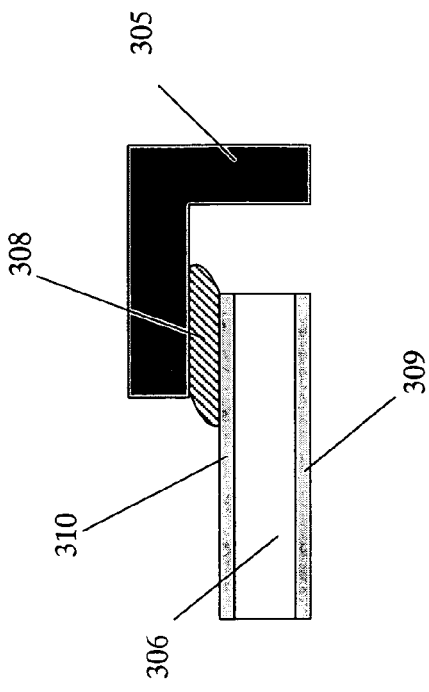
FIG. 2B is a partially enlarged section view showing the vicinity of an adhesive portion of a glass and a can.
Figure 2C:
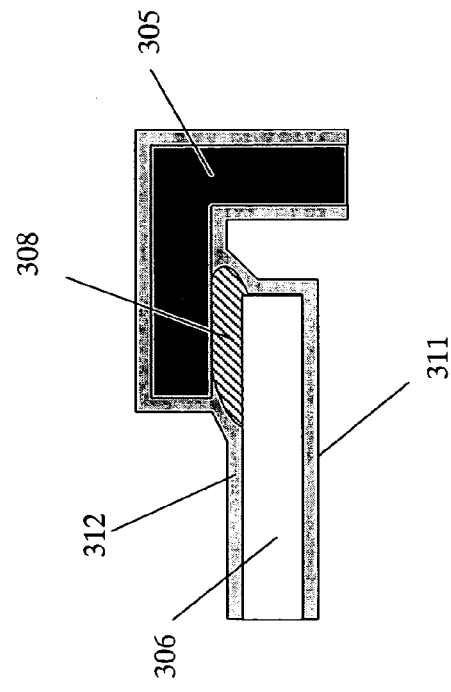
FIG. 2C is a partially enlarged section view showing the vicinity of an adhesive portion of a glass and a can in another configuration.
Figure 2A:
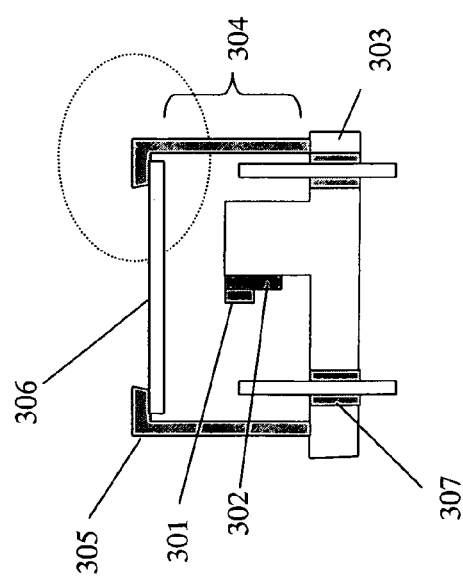
FIG. 2A is a section view showing a construction of a second embodiment of a light source of the present invention.

The light source in this embodiment includes a semiconductor laser 301, a base 303 for mounting the semiconductor 301, and a cap 304, as shown in FIG. 2A. The fundamental configuration of the semiconductor laser 301 used in this embodiment is similar to the configuration of the semiconductor laser shown in FIG. 1, but the number of ridge stripe structure for current constriction can be one.

The cap 304 includes a transparent glass 306 for taking out the laser light to the outside, and a can 305 for holding the glass 306. The semiconductor laser 301 is mounted on the base 303 via a sub mount 302, and hermetically sealed in a package constituted by the base 303, the can 305, and the glass 306. Openings are disposed in the base 303 for passing terminals therethrough, and the terminals are fixedly attached by a low-melting glass 307. The terminals are connected to the terminals of the semiconductor laser 301 by means of lines which are not shown. The glass 306 functions as a window for transmitting light (a light transmitting window).

In this embodiment, in order to increase the air-tightness, a gap between the glass 306 and the can 305 is bonded by means of a low-melting glass 308, as shown in FIG. 2B. On both of the uppermost surfaces of the glass 306, $TiO_2$ layers 309 and 310 are formed.

When the $TiO_2$ layer 309 and the $TiO_2$ layer 310 coated on the uppermost surfaces of the glass 306 are irradiated with light having wavelengths of 450 nm or less, hydrocarbon existing on the periphery can be changed into $CO_2$, $H_2O$, and the like by the photo-catalysis of $TiO_2$. Accordingly, the carbon is in a stable condition, so that the deposition of carbon on the surface of the glass 306 can be prevented. At this time, materials containing Si are also decomposed, and rendered to be harmless.

In this embodiment, the $TiO_2$ layers 309 and 310 are not formed on the entire surface of the glass 306, but selectively formed on the outer side of the center portion of the glass 306. Therefore, if the foreign materials containing carbon or Si are deposited on the $TiO_2$ layers 309 and 310, the deposition does not affect the transmission of needed laser light emitted from the semiconductor laser 301. As a result, the reduction in optical intensity does not caused.

In order to increase the photo-catalytic effect, it is preferred that the temperatures of the $TiO_2$ layers 309 and 310 in light irradiation be increased. Accordingly, in the $TiO_2$ layers 309 and 310, a region which is especially desired to exhibit photocatalysis may be selectively doped with an ultraviolet absorbing material. Alternatively, as a lower layer and/or an upper layer of the $TiO_2$ layers 309 and 310, a layer including an ultraviolet absorbing material may be formed. Preferably, such a layer including the ultraviolet absorbing material is not formed on the entire surface of the glass 306, but selectively formed on the outer side of the center portion of the glass 306. The layer including the ultraviolet absorbing material may be formed from Si or GaAs, for example.

As light with which the $TiO_2$ layers 309 and 310 are irradiated for causing the photo-catalysis, light emitted from the semiconductor laser 301 may be used. Alternatively, a light source may be disposed in the sealing package additionally to the semiconductor laser 301, and light emitted from the light source may be used. Alternatively, in the case where light emitted from a light source which is disposed externally to the sealing package may be incident on the $TiO_2$ layers, the same effects can be attained. When the $TiO_2$ layers are irradiated with light emitted from other light sources, the $TiO_2$ layers may be formed not only on the surface of the glass 306, but also on the surface of the cap 304 and/or the base 303.

On the surface of the glass 306 in this embodiment, in order to increase the taking-out efficiency of laser light, reflection free coating is performed. When the oscillation wavelength of a laser chip is λ and the refractive index of the $TiO_2$ layer is n, if the thickness of the $TiO_2$ layers coated on the surface of the glass 306 is substantially an integral multiple of λ/(2n), the reflectivity for obtaining high power laser can be easily and effectively controlled.

As shown in FIG. 2C, $TiO_2$ layers 311 and 312 may be deposited on the low-melting glass 308 for adhering the glass 306 and the can 305. With this deposition, exhaustion of volatile components from the low-melting glass 308 can be suppressed, and the density of the material to be subjected to gettering in the atmospheric gas can be reduced.

The semiconductor laser in this embodiment may have two or more ridge stripe structures. In addition, the semiconductor laser to be employed may be a great power semiconductor laser which does not necessarily require laser oscillation only in fundamental transverse mode.

Moreover, the light source of this embodiment uses the semiconductor laser formed from the III-V group nitride semiconductor material. The present invention is not limited to this. Alternatively, a light emitting device such as a light emitting diode (wavelength of 450 nm or less, for example) may be used. The semiconductor material used for the production of such light emitting devices is not limited to the III-V group nitride semiconductor material. The semiconductor material may be BAlGaInN, a mixed crystal compound semiconductor containing arsenic (As) and phosphorus (P), or other compound semiconductors.

Embodiment 3

Figure 3B:
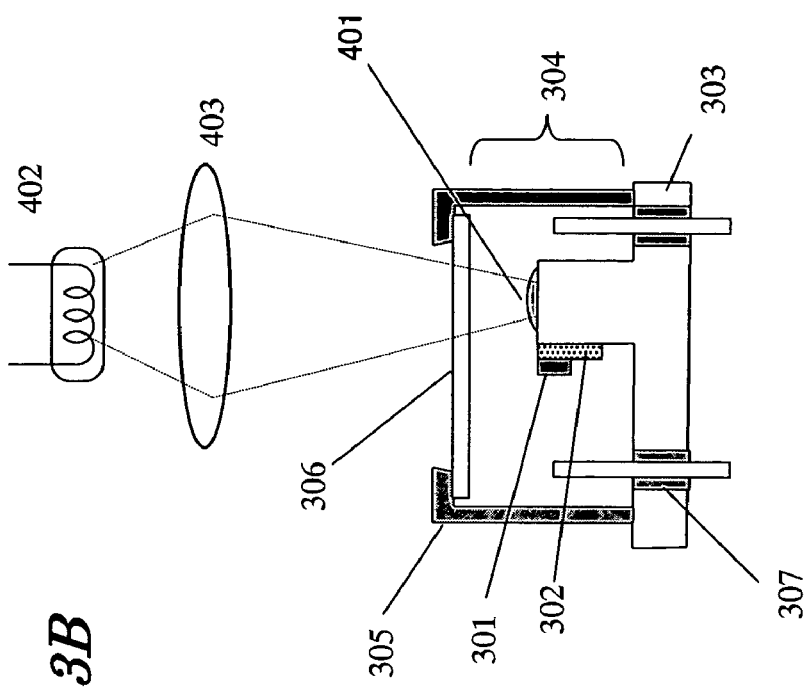
FIG. 3B is a view for illustrating a fabrication method thereof.

Hereinafter, with reference to FIGS. 3A and 3B, a third embodiment of a light source according to the present invention will be described. Also in this embodiment, as a semiconductor light emitting device, a nitride semiconductor laser element is used.

Figure 3A:
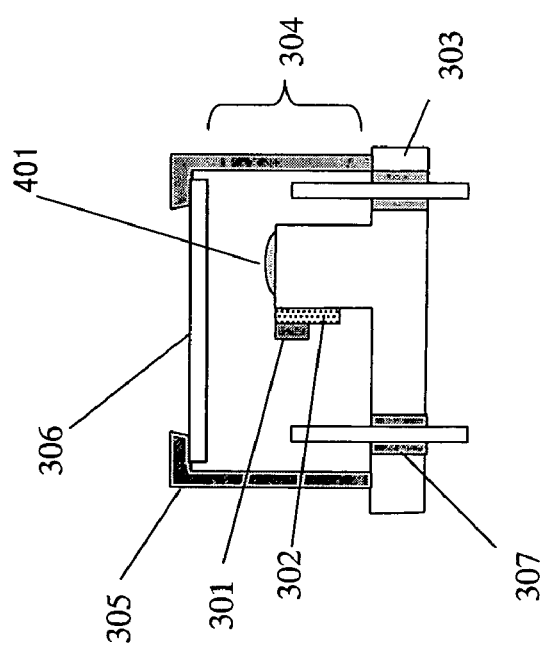
FIG. 3A is a section view showing a construction of a third embodiment of a light source according to the present invention.

The light source of this embodiment includes a semiconductor laser 301, a base 303 for mounting the semiconductor laser 301, and a cap 304, as shown in FIG. 3A. The cap 304 includes a transparent glass 306 for taking out laser light to the outside, and a can 305 for holding the glass 306. A main characteristic point of this embodiment resides in that a gettering portion 401 for depositing a material containing carbon generated from hydrocarbon or the like in the air or a material containing Si is disposed in part of the base 303. The gettering portion 401 is disposed in a position which does not interrupt the use of the semiconductor laser.

Hereinafter, a fabrication method of the light source of this embodiment will be described.

First, after the semiconductor laser 301 is mounted on the base 303 together with a sub mount 302, the cap 304 is fused and attached onto the base 303, and the semiconductor laser 301 is hermetically sealed by the base 303 and the cap 304. Thereafter, as shown in FIG. 3B, in order to perform the gettering of hydrocarbon and Si containing materials existing in the sealed inside, light (preferably having a wave-length of 450 nm or less) from the outside is converged on the gettering portion 401, thereby depositing materials containing carbon and Si. In the example shown in the figure, ultraviolet rays emitted from an Hg lamp 402 are converged on the gettering portion 401 by means of a condenser 403.

The light source which is preferably used for the gettering method includes, other than the Hg lamp, a blue LED, a blue laser, an ultraviolet LED, an ultraviolet laser, and the like.

In this embodiment, as the gettering portion 401, part of the base is utilized. However, the position in which the gettering portion 401 is formed may be in a region which does not interrupt the use of the semiconductor laser 301. For example, the gettering portion 401 may be disposed in a region other than the light emitting region of the semiconductor laser, in a sub mount on which the laser chip is mounted, or in part of the cap (in an edge portion of the glass, or the like).

In order to further increase the gettering effect, it is preferred that the temperature of the gettering portion 401 be increased in gettering. If a material which generates heat by absorbing ultraviolet rays is disposed in the gettering portion, the temperature of the gettering portion 401 can be increased without using additional heating means.

Embodiment 4

Figure 4B:
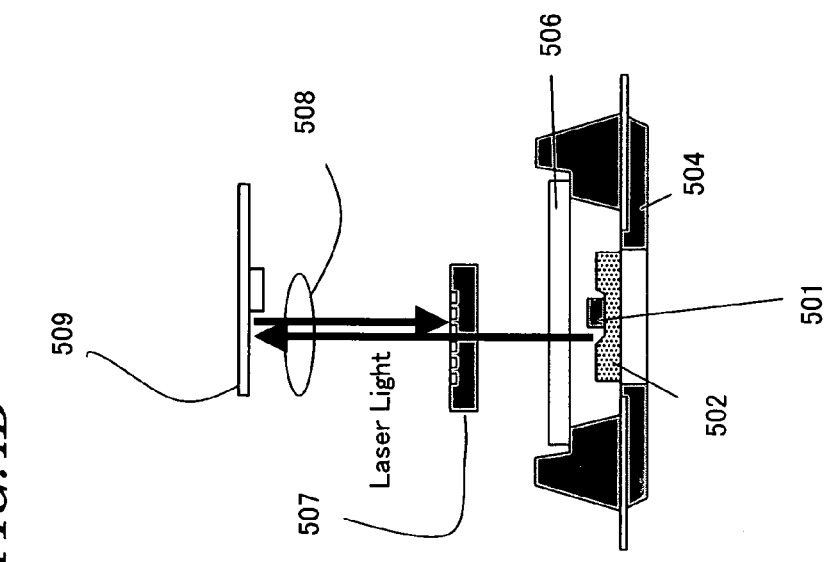
FIG. 4B is a view showing a construction of an optical pickup in the embodiment.
Figure 4A:
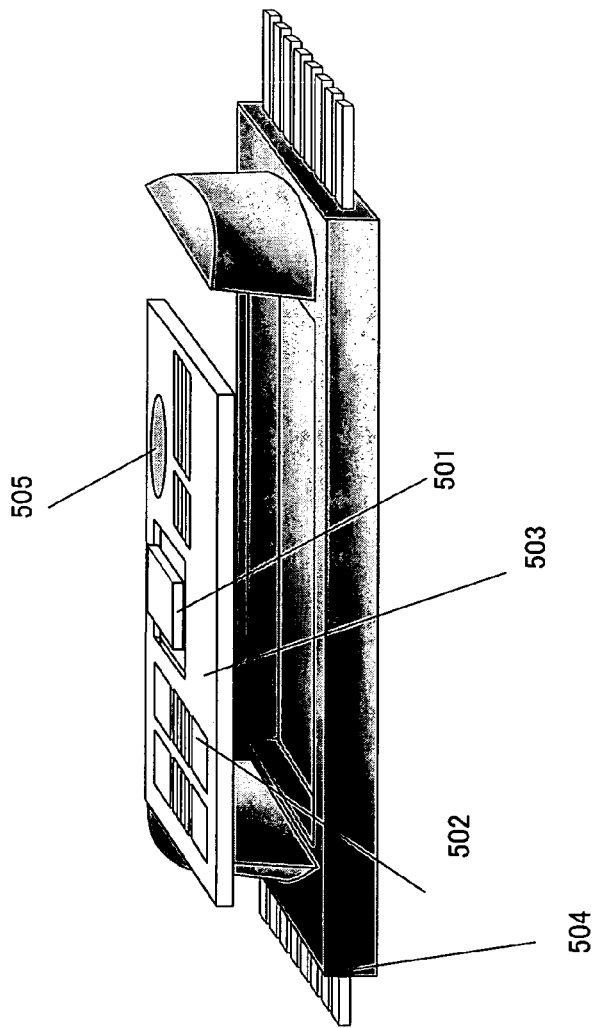
FIG. 4A is a perspective view of an optical unit used in an embodiment of an optical pickup apparatus according to the present invention.

With reference to FIGS. 4A and 4B, an embodiment of the optical pickup apparatus of the present invention will be described.

FIG. 4A is a perspective view showing an optical unit used in this embodiment. The optical unit has a construction in which a semiconductor laser and a photo detector are integrated. FIG. 4B shows a construction of an optical pickup including the optical unit as a component.

The optical unit includes a semiconductor laser 501 for emitting laser light having a wavelength of 450 nm or less, an optical system for converging laser light emitted from the semiconductor laser 501 on a recording medium, and a photo IC (a photo detector) 502 for detecting laser light reflected from the recording medium.

As shown in FIG. 4A, a recessed portion is formed in the center of a principal surface of an Si substrate 503 (7 mm×3.5 mm), and the semiconductor laser 501 is disposed on a bottom face of the recessed portion. One side face of the recessed portion formed in the principal surface of the Si substrate 503 is inclined, and functions as a micro mirror.

In the case where the principal surface of the Si substrate 503 is a (100)—orientated plane, a (111) plane is exposed by anisotropic etching, and the (111) plane can be utilized as a micro mirror. The (111) plane forms an angle of about 54 degrees with respect to the (100) plane. For this reason, if an offset substrate in which the principal surface is inclined by about 9 degrees from the (100) plane is used, the (111) plane which is inclined by 45 degrees from the principal surface can be obtained. A (111) plane disposed in a position opposed to the (111) plane forms an angle of 63 degrees with respect to the principal surface, but a micro mirror is not formed on the plane. On the plane, a photo diode for monitoring optical power is formed.

The (111) plane formed by the anisotropic etching is a smooth mirror face, so that the plane functions as a superior micro mirror. In order to further increase the reflectivity of the micro mirror, it is preferred that at least a portion functioning as the micro mirror of the inclined face of the Si substrate 503 be covered with a metal film.

On the Si substrate 503, other than the photo diode for monitoring the optical power of the semiconductor laser 501, a photo diode and a photo IC 502 for detecting an optical signal constituted by a signal processing circuit are formed.

The above-described optical unit is preferably used in a condition where the optical unit is hermetically sealed in a resin lead frame package 504 by a glass cap 506, as shown in FIG. 4B.

Hereinafter, with reference to FIG. 4B, the optical pickup apparatus of this embodiment will be described.

Laser light emitted from the semiconductor laser 501 in the optical unit is reflected by the micro mirror, and propagates in a direction substantially perpendicular to the principal surface. The laser light passing through the glass cap 506 is separated into three light beams by grating formed on a polarizing hologram element 507. For simplicity, in FIG. 4B, only one light beam is shown.

Thereafter, the light beams separated by the polarizing hologram element 507 transmit through a quarter-wave plate (not shown) and an objective lens 508, and then the light beams are converged on an optical disk 509.

The laser beams reflected from the optical disk 509 transmit through the objective lens 508 and the quarter-wave plate (not shown), and then the laser beams are diffracted by the grating formed on an upper face of the polarizing hologram element 507. The diffracted light is incident on the photo IC 502 in the optical unit, thereby generating an information signal, a focus error signal, and a tracking error signal.

As described above, if the unit in which the semiconductor laser is integrated with the photo detector such as the photo diode and the photo IC is used, the electronic apparatus such as the optical disk apparatus can be miniaturized.

According to such an optical unit, the positional relationship between the semiconductor laser and the photo detector is previously fixed in appropriate positions, so that optical alignment can be easily performed, assembly accuracy is high, and the fabrication process is easily performed.

In this embodiment, a gettering portion 505 for depositing a compound containing carbon generated from hydrocarbon and the like in the air is disposed in part of the Si substrate 503. The gettering portion 505 has the same configuration as that of the gettering portion 401 in the above-described embodiment. The position in which the gettering portion 505 is formed is determined so that the operations for data writing to the optical disk 509 and data reading from the optical disk 509 are not interrupted. Specifically, the gettering portion 505 is disposed in a region which does not cross the light path of laser light emitted from the semiconductor laser 501 and the light path of laser light reflected and returned from the optical disk 509.

Next, a fabrication method of the optical unit in this embodiment will be described.

First, an optical unit in which a semiconductor laser 501 and a photo IC 502 are integrated is mounted on a resin lead frame package 504. Then, a glass cap 506 is attached to the resin lead frame package 504 in an $N_2$ gas atmosphere, thereby hermetically sealing the optical unit in the package 504.

In this embodiment, the glass cap 506 is attached to the resin lead frame package 504 via an adhesive. As the adhesive, an epoxy resin or the like may be used, for example.

The $N_2$ gas is enclosed in the package, so that the inside of the package is in a clean gas atmosphere. However, a slight amount of organic (containing carbon) may sometimes scatter from the epoxy resin. In this embodiment, in order to catch the carbon or a slight amount of Si containing materials included in the air, light from the outside is converged on a gettering portion 505, so as to deposit the materials containing C and/or Si on the gettering portion 505.

A light source used for the gettering is a light source for emitting light having a wavelength of 450 nm or less, preferably a light source for emitting light having a wavelength of 400 nm or less. Light sources which are preferably used include an Hg lamp, a blue LED, a blue laser, an ultraviolet LED, an ultraviolet laser, and the like. Among such light sources, if a light source can be miniaturized, the light source can be disposed in the inside of the package.

In this embodiment, the semiconductor laser, the photo detector, and the micro mirror are fixed on one and the same substrate, but the elements may be separately disposed.

Embodiment 5

Figure 5:
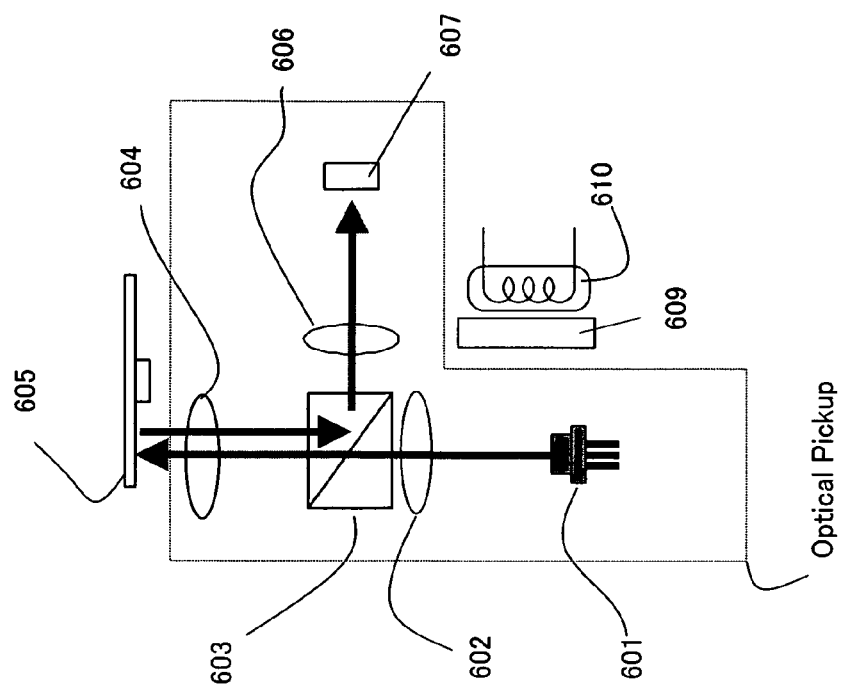
FIG. 5 is a construction view of an embodiment of an electronic apparatus (an optical disk apparatus) according to the present invention.

With reference to FIG. 5, an embodiment of the optical disk apparatus according to the present invention will be described. The optical disk apparatus of this embodiment includes an optical pickup apparatus which is shown. The components other than the optical pickup apparatus are fundamentally the same as those in a known optical disk apparatus. Therefore, hereinafter, the configuration of the optical pickup apparatus will be described.

The optical pickup apparatus shown in the figure includes a light source 601 for emitting laser light having a wavelength of 408 nm, a collimator lens 602 for collimating laser light emitted from the light source 601, a diffraction grating (not shown) for separating the collimated light into three light beams, a half prism 603 for transmitting and/or reflecting a specific component of the laser light, and a condenser 604 for converging the laser light from the half prism 603 on an optical disk 605. On the optical disk 605, a spot of converged laser is formed, thereby reading information (data) which is recorded on the optical disk 605, or writing user data to the optical disk 605.

After the laser light reflected from the optical disk 605 is reflected by the half prism 603, the laser light transmits through a photo-receiving lens 606, and then enters into a photo IC 607. The photo IC 607 includes a photo diode which is divided into a plurality of portions. Based on the laser light reflected from the optical disk 605, the photo IC 607 generates an information reproduction signal, a tracking signal, and a focus error signal. By the tracking signal and the focus error signal, a driving system such as an actuator moves an optical system including a lens, so that a position of the laser spot on the optical disk 605 is adjusted.

As described above, the optical disk apparatus in this embodiment is provided with the optical pickup apparatus including the light source 601, the converging optical system for converging laser light emitted from the light source 601 onto a recording medium, and the photo detector (the photo IC 607) for detecting laser light reflected from the recording medium, and also provided with an apparatus for generating plasma (a plasma cleaning apparatus 608) in the vicinity of the optical pickup apparatus.

The plasma cleaning apparatus 608 generates ion or ozone from oxygen and moisture in the air. The ion or ozone generated by the plasma cleaning apparatus 608 changes hydrocarbon into $CO_2$, $H_2O$, and the like by oxidation. Thus, the deposition of carbon on the surface of the components (the semiconductor laser, the lens, the mirror, and the like) of the optical pickup portion is prevented. In addition, carbon adhering to the components can be decomposed into $CO_2$ or the like, and removed. The ozone has an additional effect of decomposing an Si containing material such as siloxane.

Since the plasma cleaning apparatus 608 functions as an apparatus for performing gettering, decomposition, or vaporization of a foreign material which tends to adhere to the surface of the element, it is unnecessary for the plasma cleaning apparatus to always operate. For example, the plasma cleaning apparatus 608 may be operated at predetermined intervals, or when a reduction in optical intensity of light emitted from the semiconductor laser is observed, thereby performing the cleaning.

As the light source 601, it is preferred that the light source in the above-described embodiment be used.

Embodiment 6

Figure 6:
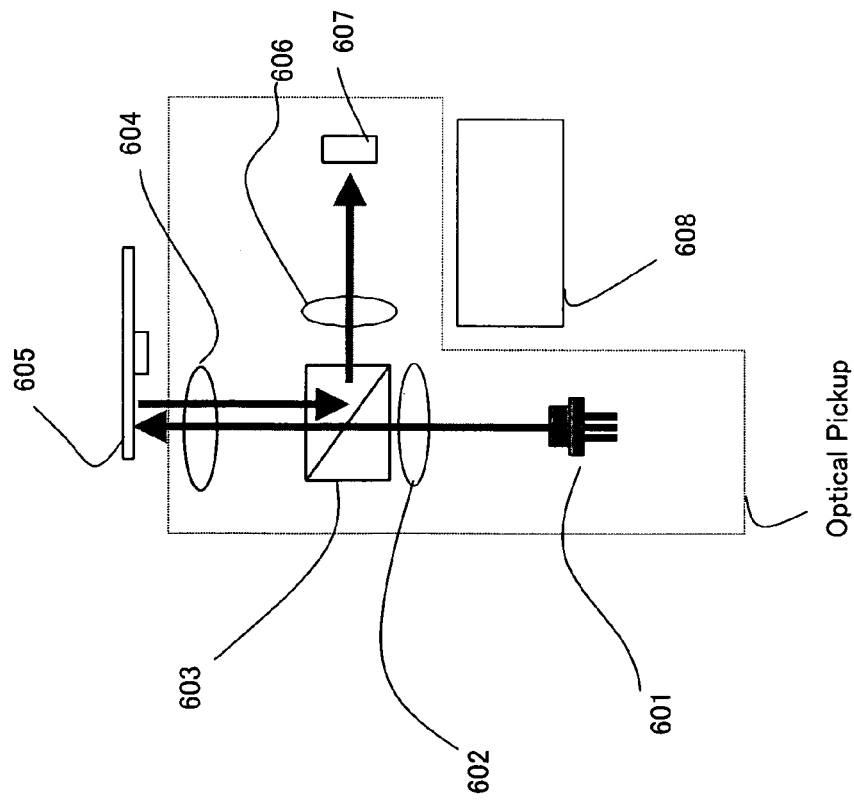
FIG. 6 is a construction view showing another embodiment of an electronic apparatus (an optical disk apparatus) according to the present invention.
Figure 7A:
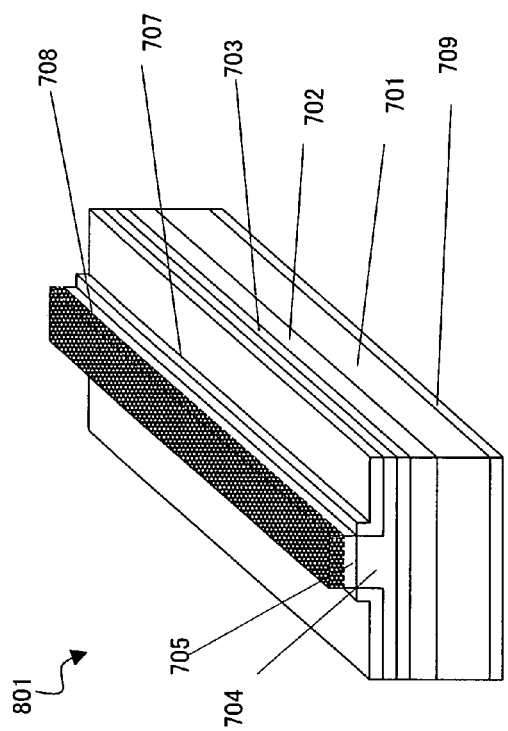
FIG. 7A is a construction view of a prior-art semiconductor laser.
Figure 7B:
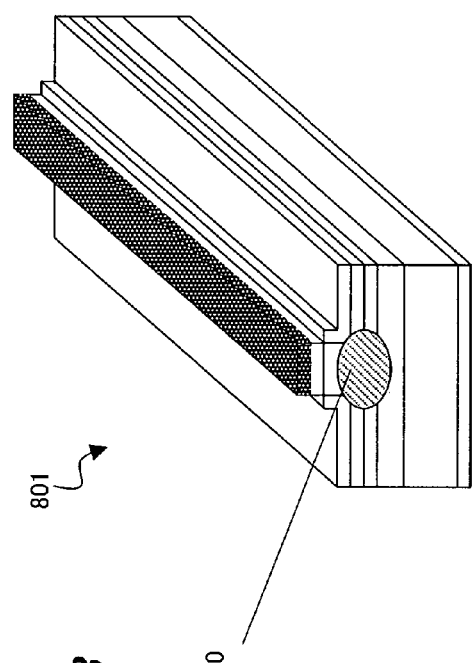
FIG. 7B is a view showing a position in which a foreign material is deposited in the prior-art semiconductor laser.

With reference to FIG. 6, another embodiment of the optical disk apparatus according to the present invention will be described. The optical disk apparatus of this embodiment has an optical pickup apparatus shown in the figure. The components other than the optical pickup apparatus are fundamentally the same as those in a known optical disk apparatus.

The optical disk apparatus of this embodiment includes an optical pickup which is the same as that in the optical pickup apparatus shown in FIG. 5, and also includes a $TiO_2$ plate 609 and an Hg lamp 610 disposed in the vicinity of the optical pickup apparatus.

The $TiO_2$ plate 609 is a member of which the surface is coated with the above-described $TiO_2$ layer. The Hg lamp 610 is a light source for emitting light having a wavelength of 450 nm or less, and more preferably 400 nm or less to the $TiO_2$ plate 609.

the $TiO_2$ plate 609 is irradiated with the light emitted from the Hg lamp 610, hydrocarbon in the atmospheric gas is decomposed and changed into $CO_2$, $H_2O$, or the like, by strong photo-catalysis of $TiO_2$. Thus, the deposition of carbon on the surface of the components (the semiconductor laser, the lens, the mirror, and the like) of the optical pickup portion is prevented.

The lightening of the Hg lamp 610 as the light source for causing the photocatalysis is not always performed, but may be performed at predetermined intervals, or when a reduction in optical intensity of light emitted from the semiconductor laser is observed, The $TiO_2$ plate 609 is disposed in the vicinity of the optical pickup portion. Alternatively, the optical pickup portion or the optical disk system may be covered with a plate to which $TiO_2$ adheres.

Instead of the additional provision of the plate 609 to which $TiO_2$ adheres, such a configuration may be alternatively adopted that the uppermost surface of the lens, the prism, and the like which constitute the optical pickup portion is coated with $TiO_2$, and the portion may be irradiated with light.

When the surface of the components of the optical pickup portion is coated with $TiO_2$, the thickness of the $TiO_2$ layer is set to be a value which does not deteriorate the functions of the respective components. When the oscillation wavelength of laser is $\lambda$, and the refractive index of $TiO_2$ is n, it is preferred that the thickness of the $TiO_2$ layer be substantially an integral multiple of $\lambda/(2n)$.

If the semiconductor laser in Embodiments 1 to 6 is used as the light source 601, an optical disk apparatus with high reliability which stably operates for the long term can be obtained.

In the above-described respective embodiments, the semiconductor laser is fabricated by using the n-type GaN substrate, but it is not necessary that the substrate be formed from GaN. The substrate of the semiconductor laser used in the present invention may be a substrate on which a III-V group nitride semiconductor material can be epitaxially grown, such as a sapphire substrate or SiC substrate.

The light emitting device used in the above-described respective embodiments is a semiconductor laser formed from a III-V group nitride semiconductor material, but the present invention is not limited to this. The light emitting device may be a light emitting device such as a light emitting diode (especially having a wavelength of 450 nm or less). The semiconductor material used for the fabrication of such a light emitting device is not limited to the III-V group nitride semiconductor material. If the semiconductor material can emit light, the semiconductor material may be BAlGaInN, or a mixed crystal compound semiconductor containing arsenic (As) and phosphorus (P).

Embodiment 7

Figure 9:
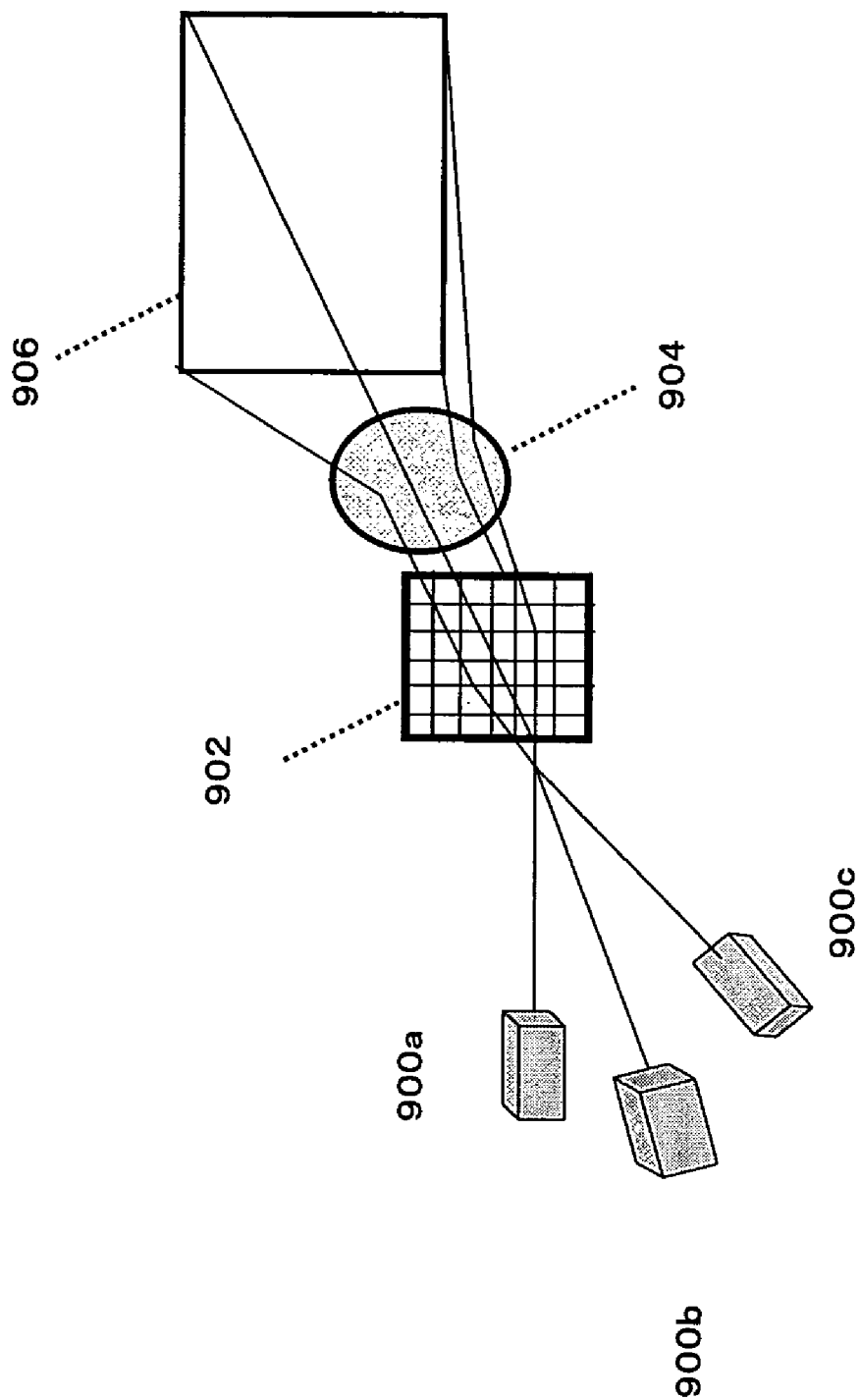
FIG. 9 is a view showing an embodiment of a laser projection-type display.

Next, with reference to FIG. 9, a laser projection type display will be described as an embodiment of an apparatus provided with the light source of the invention.

The laser projection type display includes blue, green, and red laser light sources 900a, 900b, and 900c, a spatial modulating element 902, and a projection lens 904. Image information is projected on a screen 906. The blue, green, and red laser light sources 900a, 900b, and 900c are light sources described in the embodiments of the present invention, and have the construction shown in FIG. 1, for example.

Laser light beams emitted from the laser light sources 900a, 900b, and 900c are coherent, so that a speckle noise is caused in the image formed on the screen 906. In order to remove the speckle noise, it is preferred that a scattering plate (not shown) or the like is inserted on an optical path, so as to cause vibration. Instead of the spatial modulating element 902, a two-dimensional scanning optical system including a mirror or the like may be used.

The most important techniques for practically use the laser projection type display are the performance, the lifetime, and the reliability of the blue, green, and red lasers 900a, 900b, and 900c. The red laser light is produced by using an AlGaInP semiconductor material, and obtained by a high-power semiconductor laser with high reliability. However, high-power semiconductor lasers with high reliability which emit blue and green laser light are not yet realized.

As the semiconductor laser for emitting laser light having a wavelength range of blue or green, a nitride semiconductor laser is promising. For example, in a light emitting layer of a blue-violet laser, InGaN semiconductor is used. If a mole ratio of In in the InGaN semiconductor is increased, it is possible to increase a laser oscillation wavelength.

In the case of the semiconductor laser of a region of blue or green, as compared with the semiconductor lasers of blue-violet, violet, and ultraviolet, a reduced amount of foreign material adheres to the light emitting end face. However, visible laser used in a laser display is higher power than the laser used in an optical disk. For this reason, the adhesion of foreign materials to the light emitting end face or the like results in a problem.

In this embodiment, the above-mentioned material containing carbon or silicon is removed by gettering or decomposed by plasma, so that a large-screen laser projection type display with high luminance can be realized.

Since the laser display is an electronic apparatus using high-power laser, the adhesion of a material containing carbon or silicon to the elements included in the optical system in such an electronic apparatus (a lens, a spatial modulating element, or the like) may cause a problem. However, as in the above-described embodiments, an apparatus for performing gettering, decomposition, or vaporization of a foreign material which tends to adhere to the surface of the component is disposed, so that the adhesion to the optical system can be reduced. Thus, stable operation can be realized.

As described above, according to the present invention, by the function of the gettering portion or the gettering apparatus, gettering or decomposition of materials mainly containing carbon or silicon is performed, so that it is possible to provide a light source which can stably operate for the long term, and various apparatuses provided with the light source.

The light source of the present invention is useful as a light source for reading and writing data in optical disk related fields. Moreover, the light source of the invention can be applied to various electronic apparatuses such as a laser printer, and a laser display.

While the present invention has been described in a preferred embodiment, it will be apparent to those skilled in the art that the disclosed invention may be modified in numerous ways and may assume many embodiments other than that specifically set out and described above. Accordingly, it is intended by the appended claims to cover all modifications of the invention which fall within the true spirit and scope of the invention.

This application is based on Japanese Patent Applications No. 2003-390517 filed Nov. 20, 2003 and No. 2004-332600 filed Nov. 17, 2004, the entire contents of which are hereby incorporated by reference.

What is claimed is:

1. A fabrication method of a light source comprising the steps of:
   providing a semiconductor light emitting device which has a light emitting face and emits light from a part of the light emitting face;
   providing a container which has a light transmitting window for transmitting the light and accommodates the semiconductor light emitting device;
   accommodating the semiconductor light emitting device in the container, thereby blocking the semiconductor light emitting device from the air; and
   performing gettering of a material containing at least one of carbon and silicon, by irradiating with light a region that is positioned in the container, and the region being positioned other than the part of the light emitting face of the semiconductor light emitting device.

2. The fabrication method of claim 1, wherein a wavelength of light with which the irradiation is performed in the gettering step is 450 nm or less.

3. The fabrication method of claim 2, wherein the irradiation with light is performed by using one of an Hg lamp, a blue LED, a blue laser, an ultraviolet LED, and an ultraviolet laser.

4. The fabrication method of claim 1, wherein the semiconductor light emitting device is formed from a III-V group nitride semiconductor material.

5. The fabrication method of claim 1, wherein the material containing the at least one of carbon and silicon is included in an atmosphere in the container.

6. The method of claim 1, wherein the semiconductor light emitting device includes:
   a substrate;
   a multilayer structure including a first conductive-type cladding layer, an active layer, and a second conductive-type cladding layer, the multilayer structure being formed on the substrate;
   a main current confinement structure for injecting a carrier into a first region of the active layer; and
   a sub current confinement structure for injecting a carrier into a second region of the active layer, wherein the step of performing gettering includes irradiating the region with light from the second region of the active layer.

7. The method of claim 1, wherein the step of performing gettering includes irradiating the region with light from the outside of the container.

* * * * *